US007442968B2

(12) United States Patent
Kim et al.

(10) Patent No.: US 7,442,968 B2
(45) Date of Patent: Oct. 28, 2008

(54) CHIP ON FILM (COF) PACKAGE HAVING TEST PAD FOR TESTING ELECTRICAL FUNCTION OF CHIP AND METHOD FOR MANUFACTURING SAME

(75) Inventors: Hyoung-ho Kim, Anyang (KR); Ye-jung Jung, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/061,099

(22) Filed: Feb. 1, 2002

(65) Prior Publication Data

US 2002/0139567 A1    Oct. 3, 2002

(30) Foreign Application Priority Data

Mar. 30, 2001    (KR) .............................. 2001-16871

(51) Int. Cl.
*H01L 21/00*    (2006.01)
(52) U.S. Cl. ..................... 257/200; 257/668; 257/730
(58) Field of Classification Search ................ 257/200, 257/668, 730
See application file for complete search history.

(56) References Cited

U.S. PATENT DOCUMENTS 5,382,300 A * 1/1995 Blonder et al. ............. 148/24
5,888,837 A * 3/1999 Fillion et al. ............... 438/15
6,894,525 B2 * 5/2005 Muff et al. .................. 324/765
7,032,807 B2 * 4/2006 Bayot ..................... 228/180.22
2002/0139567 A1 * 10/2002 Kim et al. ................... 174/250
2004/0251926 A1 * 12/2004 Muff et al. .................. 324/765
2005/0133573 A1 * 6/2005 Bayot ......................... 228/207

FOREIGN PATENT DOCUMENTS

| JP | 06-222109 | 8/1994 |
| JP | 2000-208717 | 7/2000 |
| JP | 2000-259091 | 9/2000 |
| JP | 2000-294897 | 10/2000 |

* cited by examiner

*Primary Examiner*—Laura M Menz
(74) *Attorney, Agent, or Firm*—F. Chau & Assoc., LLC.

(57) ABSTRACT

A chip on film (COF) package comprising a test pad for testing the electrical function of a semiconductor chip and a method for manufacturing same are provided. The COF package comprises a semiconductor chip mounted on a base film, a signal-input portion for receiving data and control signals and transmitting the data and control signals to the semiconductor chip, a plurality of passive elements connected to terminals of the semiconductor chip, and a plurality of test pads for testing one or more terminals of the semiconductor chip that are not connected to the signal-input portion. The test pads of the COF package are capable of testing a plurality of internal terminals which are integrated into one terminal and do not connected to the signal-input portion, thereby easily testing the electrical function of the chip.

7 Claims, 3 Drawing Sheets

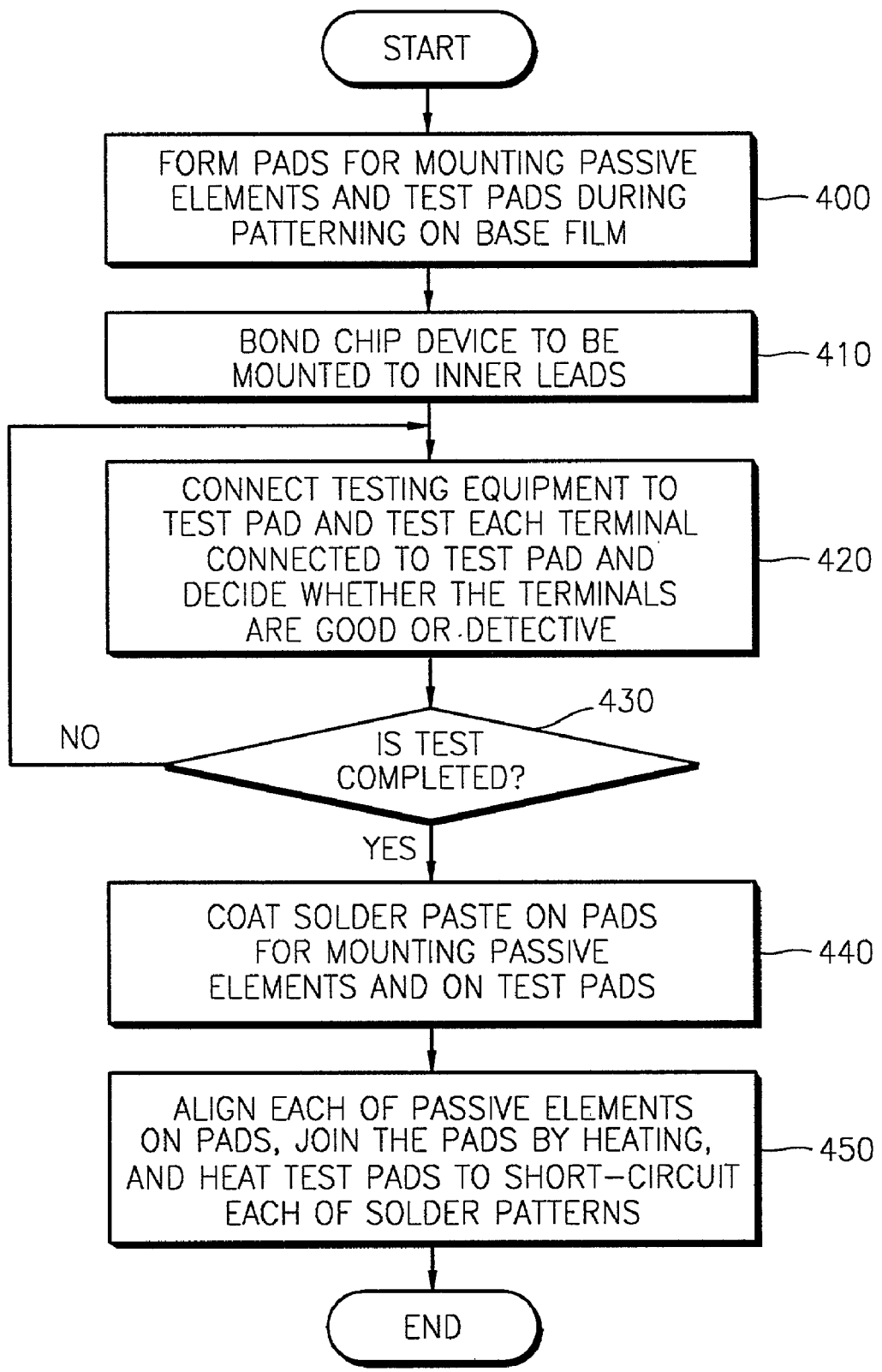

CHIP ON FILM (COF) PACKAGE HAVING TEST PAD FOR TESTING ELECTRICAL FUNCTION OF CHIP AND METHOD FOR MANUFACTURING SAME

CROSS-REFERENCE TO RELATED APPLICATION

This application claims priority to Korean Patent Application No. 2001-16871 filed on Mar. 30, 2001.

BACKGROUND

1. Field of the Invention

The present invention relates to a semiconductor device, and more particularly, to a chip on film (COF) package comprising test pads for testing the electrical function of the internally formed chip terminals and a method for manufacturing the COF package.

2. Description of Related Art

As electronic devices employing a liquid crystal device (LCD) become thinner and smaller, integrated circuit (IC) packages for LCDs are required to have a larger amount of input/output terminals to perform various functions, while at the same time becoming thinner. A tape carrier package (TCP) technique for manufacturing an integrated circuit (IC) having a tape-shaped package has been developed to meet such requirements.

TCP comprises a tape automated bonding (TAB) package and a chip on film (COF) package. TAB package technique comprises coating an adhesive on a tape (which is used for a base film), and adhering a copper (Cu) foil to the tape by using the adhesive. The adhered Cu foil is then wired according to a designed pattern, and a lead wired on the tape is connected to a chip. Because TAB packages are thinner and have improved flexibility, they are typically used in various electronic devices such as laptop computers (notebook computers), mobile phones, watches, and measuring instruments and apparatuses.

A COF package technique provides an improvement over the TAB package technique. For instance, since the thickness of a polyimide tape of COF package is 25 m, the COF package has more flexibility than the TAB package having the polyimide tape of 75 m. Further, since passive elements such as resistors and capacitors can be mounted on the COF package, the size of an external printed circuit board (PCB) can be reduced. That is, the COF packages mount the passive elements thereon, thereby improving noise properties and minimizing the number of terminals of a connector for connecting to the external PCB.

However, a conventional COF package has a disadvantage in that the number of terminals to be tested is limited. For instance, several terminals of a semiconductor chip device are integrated into one terminal through capacitors and resistors and are connected to an external PCB. On the other hand, the electrical function testing of the COF package is performed by using the terminals of the connector connected to the external PCB. Thus, many terminals internally formed in a COF package cannot be tested for electrical function. As a result, it is difficult for a conventional COF package to test electrical function on each pad of a chip.

SUMMARY OF THE INVENTION

It is an object of the present invention to provide a chip on film (COF) package comprising test pads capable of easily testing the electrical function of the internally formed chip terminals.

It is another object of the present invention to provide a method for manufacturing a chip on film (COF) package.

According to one aspect of the present invention, there is provided a chip on film (COF) package comprising a semiconductor chip mounted on a base film. The COF package comprises a signal-input portion for receiving data and control signals and for transmitting the data and the control signals to the semiconductor chip; a plurality of passive elements connected to terminals of the semiconductor chip; and a plurality of test pads for testing one or more terminals of the semiconductor chip that are not connected to the signal-input portion.

According to another aspect of the present invention, there is provided a chip on film (COF) package comprising a semiconductor chip mounted on a base film. The COF package comprises a connector comprising a plurality of terminals connected to terminals of the semiconductor device, and a plurality of test pads, internally formed in the COF package, for testing terminals of the semiconductor device that are not connected to the connector.

According to further aspect of the present invention, there is provided a method for manufacturing a chip on film (COF) package comprising a semiconductor chip mounted on a base film. The method comprises the steps of forming a pad for mounting passive elements and forming at least one test pad during patterning the base film, wherein the test pad comprises a plurality of patterns connected to different terminals of the semiconductor chip; bonding the semiconductor chip to an inner lead formed on the base film; testing each terminal connected to the test pad; coating the pad for mounting the passive element and the test pad with a solder paste after completing the testing of the terminals connected to the test pad; aligning and joining the passive element on a predetermined pad; and heating the test pad to short-circuit the patterns.

BRIEF DESCRIPTION OF THE DRAWINGS

The foregoing and other objects, aspects and advantages will become better understood from the following detailed description of preferred embodiments of the invention with reference to the drawings, in which:

FIG. 4 is a flow chart illustrating a method for manufacturing a COF package according to a preferred embodiment of the present invention.

DETAILED DESCRIPTION OF PREFERRED EMBODIMENTS

Figure 1:
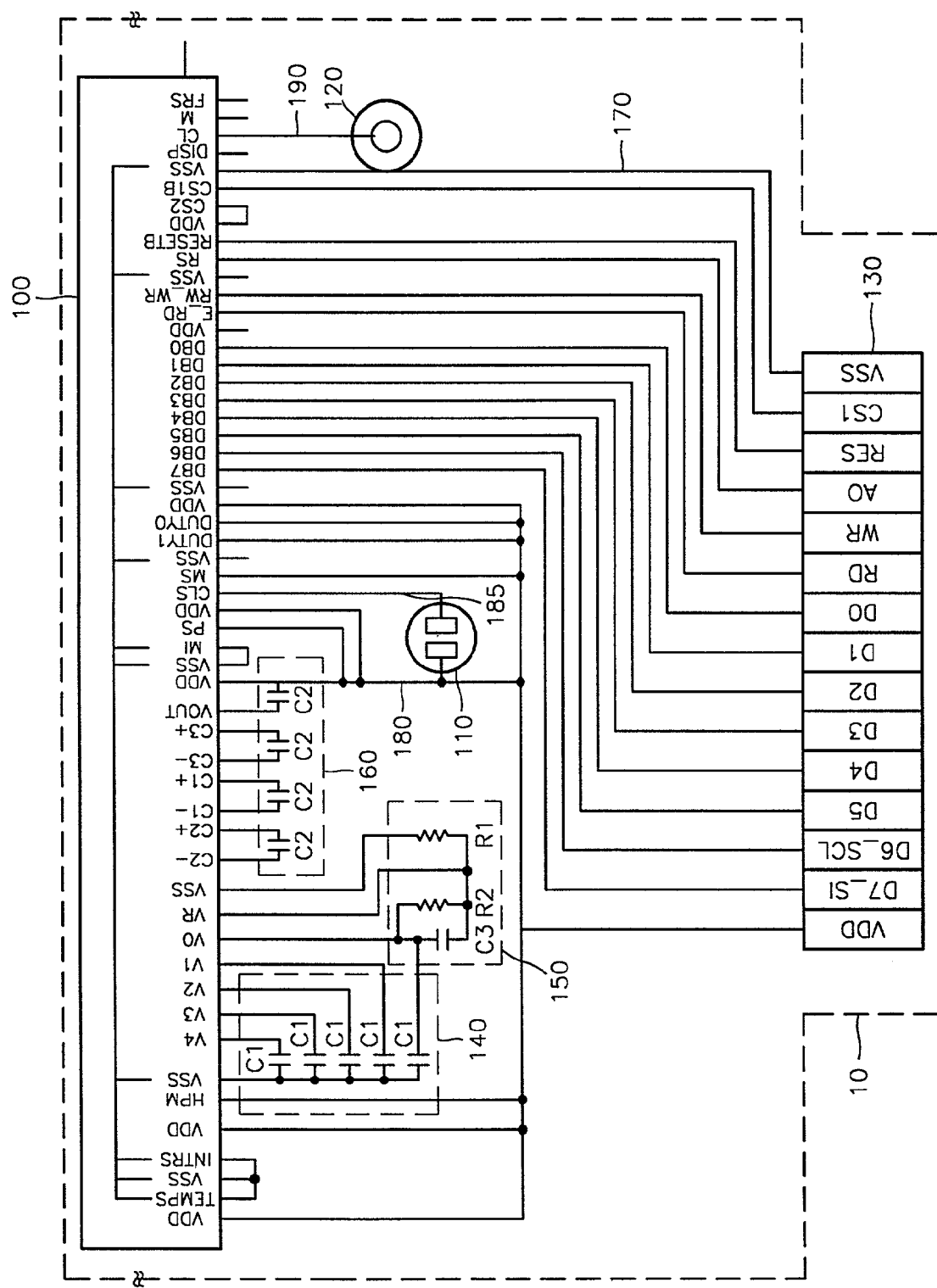
FIG. 1 illustrates a chip on film (COF) package according to a preferred embodiment of the present invention.

FIG. 1 illustrates a chip on film (COF) package according to a preferred embodiment of the present invention. For example, FIG. 1 shows a COF package used for a liquid crystal device (LCD) driver chip.

Referring to FIG. 1, a COF package 10 comprises a LCD driver chip 100, patterned signal lines 170, test pads 110 and 120 for testing electrical functions of the chip 100, passive elements 140, 150, and 160, and a signal-input portion 130. The COF package adheres a copper (Cu) foil to a tape and is wired according to a design pattern without coating an adhesive on a polyimide base film.

The signal-input portion 130 comprises terminals for communicating with an external printed circuit board (PCB), and, through the terminals, receives a plurality of data and control signals from an external control circuit (for example, a microprocessor). The signal-input portion 130 transmits data and control signals to the LCD driver chip 100 through the signal lines 170.

For instance, the signal-input portion 130 comprises input/output terminals D0 through D7 for inputting or outputting predetermined data, for example, 8-bit data, from a microprocessor (not shown), RD and WR terminals for receiving a read enable signal and a write enable signal, respectively, an AO terminal for selecting whether the input/output terminals D0 through D7 input data (that is displayed on a LCD) or control signals, a RES terminal for inputting a RESET signal, and a CS1 terminal for selecting a chip. Further, the signal-input portion 130 comprises a supply voltage VDD and a ground voltage VSS. The data and the control signals are enabled only if the CS1 is enabled.

The signal lines 170 connect the signal-input portion 130 to each terminal of the LCD driver chip 100.

The LCD driver chip 100 receives predetermined data and control signals from a microprocessor (not shown) through the signal-input portion 130 and the signal lines 170. The LCD driver chip 100 generates driving signals for driving a LCD panel (not shown) and outputs the driving signals to the LCD panel such that a screen is displayed on an external LCD panel. An output terminal of the LCD panel is not shown in FIG. 1 for simplicity.

The LCD driver chip 100 comprises a TEMPS terminal for controlling a rate of variation in voltage according to variation in temperature, an INTRS terminal for deciding the gain of an internal operational amplifier (not shown) of the LCD driver chip 100 and for determining whether an internal resistor is used for controlling the gain, a power control terminal HPM for a power supply circuit of the LCD driver and for representing a normal node or a high power mode in accordance with a level state such as high or low, and LCD driving voltage terminals V0 through V4 each having a different voltage level from each other. For example, if the chip 100 comprises a voltage generating circuit, the different voltages of the terminals V1 through V4 can either be internally generated from a high voltage V0 or can be provided from an external source. Each of the terminals V0 through V4 is connected to the passive element 140 external to the chip 100.

The LCD driver chip 100 further comprises a VR terminal for controlling voltage V0 and for controlling the voltage of the terminal V0 by using the passive element 150 when the chip 100 does not comprises resistors for voltage control. Further, terminals C2+, C2−, C1+, C1−, C3+, and C3− are for connecting capacitors for an internal voltage booster (that are capacitors of the passive element 160). The chip 100 further comprises a MI terminal for deciding the type of a microprocessor, a PS terminal for deciding a data interface mode and for selecting parallel or serial data input, and a CLS terminal for enabling/disabling the inputting of test clock signal. For instance, when the CLS terminal is set to a high level to enable the CLS terminal, an internal clock signal is output through a CL terminal. When the CLS terminal is set to a low level to disable the CLS terminal, an external clock signal is input through the C1 terminal. The LCD driver chip 100 further comprises a MS terminal for selecting a master mode or a slave mode, and DUTY0 and DUTY1 terminals for deciding the duty rates of the LCD driver.

Furthermore, the LCD driver chip 100 comprises DB0 through DB7 terminals for inputting 8-bit parallel data from, or outputting 8-bit parallel data to, an external microprocessor connected to the terminals D0 through D7 of the signal-input portion 130, a E_RD terminal for inputting a read enable clock signal, a RW_WR terminal for read/write control, and a RS terminal for inputting a register select signal. For example, the RE_WR terminal may be used as a read/write control input terminal or a write enable clock-input terminal according to the type of the microprocessor. For instance, the DB0 through DB7 terminals can be used for controlling data or display data depending on whether the RS terminal is set to a high level or a low level.

The LCD driver chip 100 further comprises a RESETB terminal for inputting a reset signal, CS2 and CS1B terminals for inputting chip select signals, a DISP terminal for inputting/outputting a LCD display blanking control signal, a CL terminal for inputting/outputting a display clock, a M terminal for inputting/outputting a LCD AC signal, and a FRS terminal for outputting a static driver segment for the LCD panel.

The passive element 140 comprises a plurality of passive elements, for example, capacitors and resistors, to be mounted on the COF package 10. In the exemplary embodiment of FIG. 1, the passive element 140 comprises capacitors C1 connected between the V0 through V4 terminals and the ground voltage VSS to stabilize each of the voltages V0 through V4, thereby removing ripple components.

The passive element 150 comprises elements, for example, resistors R1 and R2, and a capacitor C3, for controlling the voltage V0. The passive element 160 comprises a plurality of capacitors C2 for voltage boosting and being connected to the C2− and C2+, C3+ and C3−, and C1+ and C1− terminals, respectively.

In one embodiment of the present invention, the COF package 10 comprises test pads 110 and 120 for testing the electrical function of internally formed terminals of the LCD driver chip. The test pads 110 and 120 test terminals do not lead to the outside of the COF package 10 through the signal-input portion 130.

Figure 2:
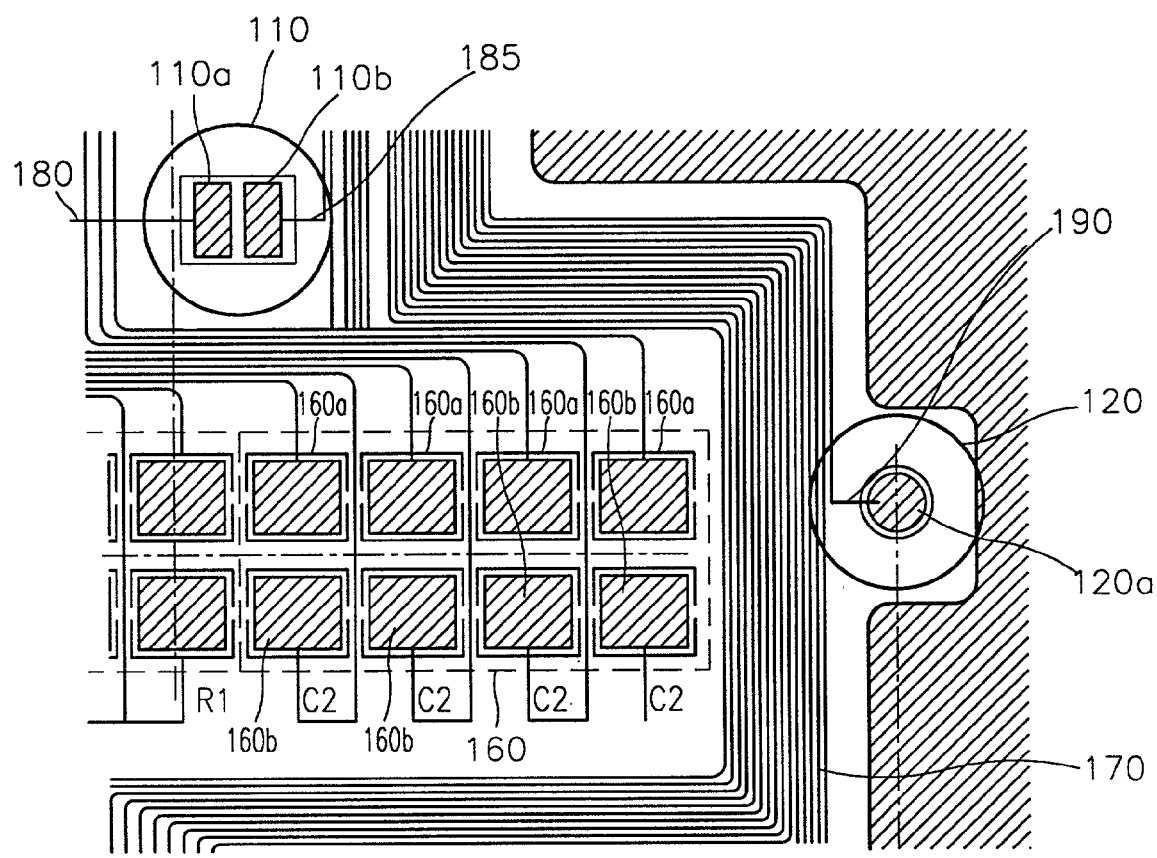
FIG. 2 is a detailed partial diagram of the COF package comprising the test pads of FIG. 1.

FIG. 2 is a detailed partial diagram of the COF package comprising the test pads of FIG. 1. Referring to FIG. 2, the first pad 110 comprises first and second solder patterns 110a and 110b connected to a line 180 for a supply voltage VDD and a CLS signal line 185, respectively. The first and second solder patterns 110a and 110b are short-circuited to each other after the testing is completed. The second pad 120 is separately formed from the first pad 110 and is connected to a CL signal line 190, so that a clock signal input/output from the CL terminal can be tested.

Advantageously, the test pads 110 and 120 according to present invention test the electrical functions of terminals of the chip package which do not lead to the outside of the chip package and are integrated into one terminal. For example, the electrical function of the CLS and CL terminals can be tested by the first and second pads 110 and 120 according to the present invention. In contrast, with the conventional COF package, it is not possible to test the electrical function of the CLS terminal because the terminal is always connected to the supply voltage VDD. Further, with the conventional COF package, a test cannot be performed to determine whether the clock signal is normally input or output to the CL terminal, since the input or output to the CL terminal depends on the CLS terminal.

Referring again to FIG. 2, the first pad 110 preferably comprises a first solder pattern 110a and a second solder pattern 110b. The first solder pattern 110a comprises one side connected to the line 180 for receiving a supply voltage VDD, and the second pattern 110b comprises one side connected to the CLS signal line 185. A second pad 120 comprises a third solder pattern 120*a* connected to a CL signal line 190.

In the COF package 10 according to the invention, each of the passive elements C2 of the passive element 160 is soldered between a first pattern pad 160*a* and a second pattern pad 160*b* of the passive element 160. The electrical function tests by the test pads 110 and 120 are performed before soldering each of the passive elements C2 to each pad of the passive element 160. Thus, when the passive element 160 is soldered between the first pattern pad 160*a* and the second pattern pad 160*b* after completing the electrical function test by the test pads 110 and 120, the first and second solder patterns 110*a* and 110*b* of the test pad 110 are short-circuited to each other.

Figure 3:
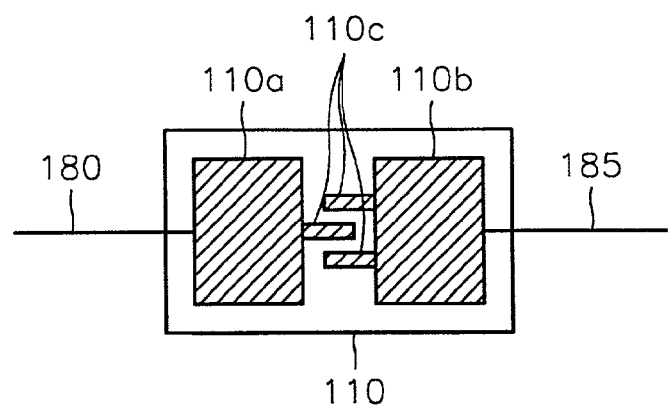
FIG. 3 is a detailed diagram of the first test pad of FIG. 2.

FIG. 3 is a detailed diagram of the first test pad of FIG. 2. Referring to FIG. 3, a test pad 110 comprises first and second solder patterns 110*a* and 110*b* and protrusion patterns 110*c* alternately formed on the center of the solder patterns 110*a* and 110*b* such that the first and second solder patterns 110*a* and 110*b* are easily short-circuited to each other after completing the electrical function test by the first test pad.

FIG. 4 is a flow chart illustrating a method for manufacturing a COF package according to one aspect of the present invention. Referring to FIGS. 1 to 4, when a base film is patterned, the pads (for example, 160*a*, 160*b* of FIG. 2) for mounting passive elements and a plurality of test pads (for example, 110 and 120) are formed on the base film (step 400). At this time, inner leads for mounting a chip (for example, the LCD driver chip 100 of FIG. 1) are simultaneously formed on the base film. Here, the patterning of the base film preferably comprises adhering a Cu foil on the base film such as a polyimide tape, and wiring the adhered Cu foil according to a designed pattern. Thus, the LCD driver chip 100 to be mounted and the inner leads are bonded to each other, so that the driver chip 100 is mounted on the base film (step 410).

After applying a testing equipment (not shown) to the test pad 110, each terminal connected to the test pad 110 is tested to decide whether or not a terminal is defective (step 420). Once the testing is complete (affirmative result in step 430), a solder paste is coated on the pads 160*a* and 160*b* for mounting passive elements and on the test pad 110 (step 440), so that the passive elements such as capacitors and resistors are soldered to the base film by a surface mount device (SMD) method. In one embodiment, a screen-printing method using a metal mask or a solder dotting method may be applied to the pads 160*a* and 160*b* on which the passive elements are placed. These methods are well known to a person skilled in the art. Thus, a detailed description thereof will be omitted.

Next, the passive elements are aligned on the pads 160*a* and 160*b* and the heating process is performed to join the passive elements and the pads 160*a* and 160*b* (step 450). The test pads for which the electrical function test is completed are heated to short-circuit each of the solder patterns. For example, SMD mounting equipment is used for aligning the passive elements on the pads 160*a* and 160*b*. The heating process for soldering the passive elements to the pads comprises a reflow method and a laser radiation method. The reflow method joins the pads 160*a* and 160*b* to the passive elements by passing the pads through a heated portion. The laser radiation method joins the pads 160*a* and 160*b* to passive elements by radiating a laser beam onto a desired portion. Similarly, the test pad 110 may be heated by the reflow method or laser radiation method to short-cut the solder patterns 110*a*, 110*b* to each other.

The solder patterns 110*a*, 110*b*, and 110*c* of the test pad 110 can be implemented by various methods. For instance, if there is a chip terminal to be tested, a test pad may be formed on a remaining portion of a base film. After completing the electrical function test of the chip terminal by the test pad, the patterns of the base film are connected to one another. Further, a separate pad such as the test pad 120 of FIG. 1 may be formed on a base film for the terminals requiring an electrical function test.

Advantageously, a COF package according to an embodiment of the present invention comprises a plurality of the passive elements and test pads for testing the electrical function of internally formed chip terminals, which are integrated into one terminal and do not lead to the outside of the COF package, thereby easily performing an electrical function test. Further, a COF package according to a preferred embodiment of the present invention maximizes the advantages of mounting the passive elements with minimizing the limitation of the electrical function test by a conventional COF package.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A chip on film (COF) package comprising a semiconductor chip mounted on a base film, the COF package comprising:
    a signal-input portion for receiving a supply voltage, data, and control signals and for transmitting the supply voltage, the data, and the control signals to the semiconductor chip;
    a plurality of passive elements connected to respective terminals of the semiconductor chip; and
    a plurality of test pads for testing one or more terminals of the semiconductor chip that are not connected to the signal-input portion, wherein each of the plurality of test pads comprises a first solder pattern connected to a terminal of the semiconductor chip, and a second solder pattern connected to another terminal of the semiconductor chip.

2. The COF package of claim 1, wherein the first and second solder patterns are arranged adjacent each other and comprise protrusion patterns formed to extend between the first and second solder patterns.

3. The COF package of claim 2, wherein the protrusion patterns of the first and second solder patterns are modified so as to connect the first and second solder patterns to each other.

4. The COF package of claim 1, wherein the plurality of test pads further comprise a dedicated test pad that is separately formed from the one of the plurality of test pads for testing a terminal of the semiconductor chip.

5. The COF package of claim 1, wherein the plurality of test pads comprises:
    a first test pad including a first solder pattern connected to the
    supply voltage and a second solder pattern separate from the first solder pattern and connected to another terminal of the semiconductor chip; and
    a second test pad separately formed from the first test pad and connected to yet another terminal of the semiconductor chip.

6. The COF package of claim 1, wherein the semiconductor chip comprises a liquid crystal device (LCD) driver chip for driving an external LCD.

7. The COF package of claim 6, wherein the test pads comprise first and second solder patterns connected to a supply voltage terminal and a clock enable terminal of the semiconductor chip, respectively, wherein the first and second solder patterns are short-circuited after testing the electrical function of the supply voltage terminal and the clock enable terminal of the semiconductor chip.

* * * * *